United States Patent [19]

Gentric et al.

[11] 4,362,286

[45] Dec. 7, 1982

[54] QUARTER-TURN-LOCKING THERMAL CONNECTOR

[76] Inventors: Alain Gentric, 27 Lotissement de Keranroux, Ploubezre, 22300 Lannion; Jean Le Rouzic, 23, rue de Bourgogne, 22300 Lannion, both of France

[21] Appl. No.: 148,944

[22] Filed: May 12, 1980

[30] Foreign Application Priority Data

May 15, 1979 [FR] France ................................ 79 12310

[51] Int. Cl.³ .......................... A47B 96/06; E04G 3/00
[52] U.S. Cl. ......................................... 248/229; 24/337
[58] Field of Search ............... 248/229, 316 D, 316 E; 24/248 E, 333, 337

[56] References Cited

U.S. PATENT DOCUMENTS

| 584,329 | 6/1897 | Colton | 24/248 E |
| 597,511 | 1/1898 | Powell | 24/248 E |
| 1,716,928 | 6/1929 | Mirkin | 24/248 E |

Primary Examiner—Wayne L. Shedd

Attorney, Agent, or Firm—Lane, Aitken, Kice & Kananen

[57] ABSTRACT

A thermal connector adapted to connect a calorie dissipating support to a thermal drain. It comprises a deformable metal two-part clamp, each part of which is constituted by two webs conforming to the shape of the dissipating support, as regards one of said clamp-parts, and the shape of the thermal drain, as regards the other clamp-part. Said connector is also provided, between said two clamp-parts, with a housing for an actuating-key with longitudinal edges, said key having a position of rest at which said longitudinal edges do not exert any force whatever on the walls of said central housing, the webs of the end clamp-parts being then moved apart and said connector being unlocked, and a working position, obtained by causing said key to rotate by a quarter turn with respect to said position of rest; said key has then the function of moving apart the walls of said central housing and to draw the webs of each of said end clamp-parts nearer to each other, said connector being thus locked.

5 Claims, 13 Drawing Figures

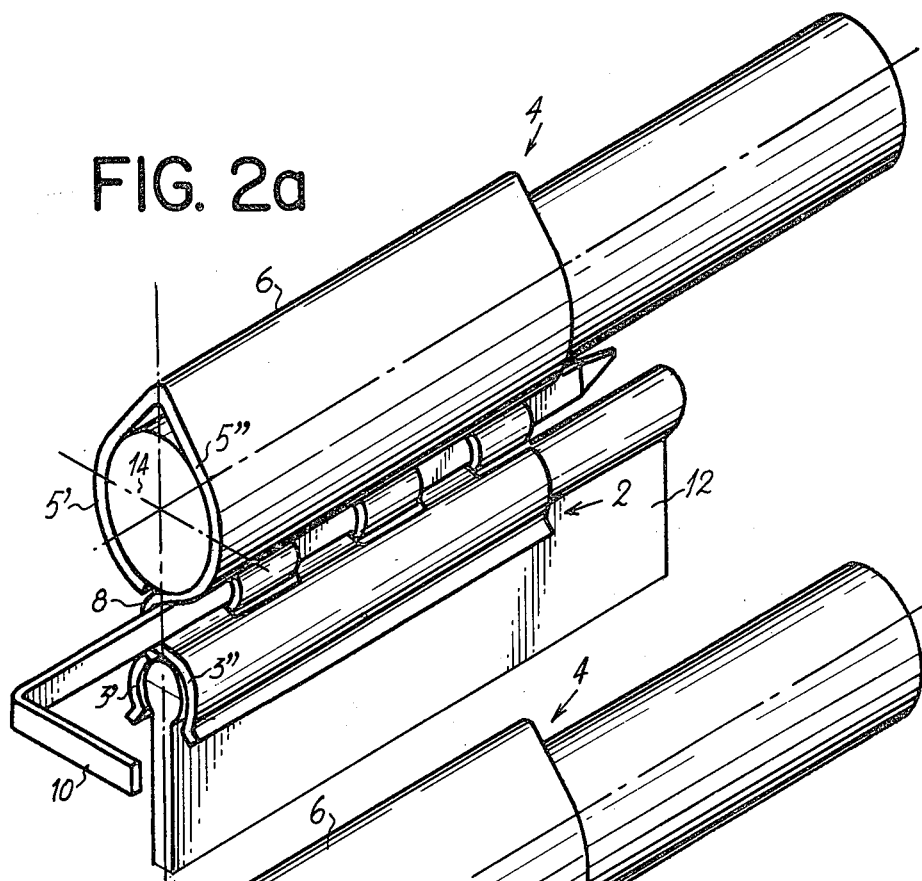
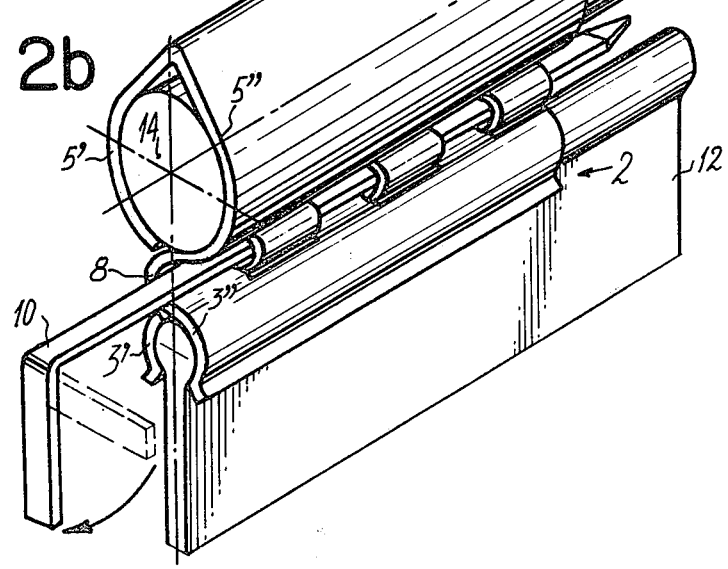

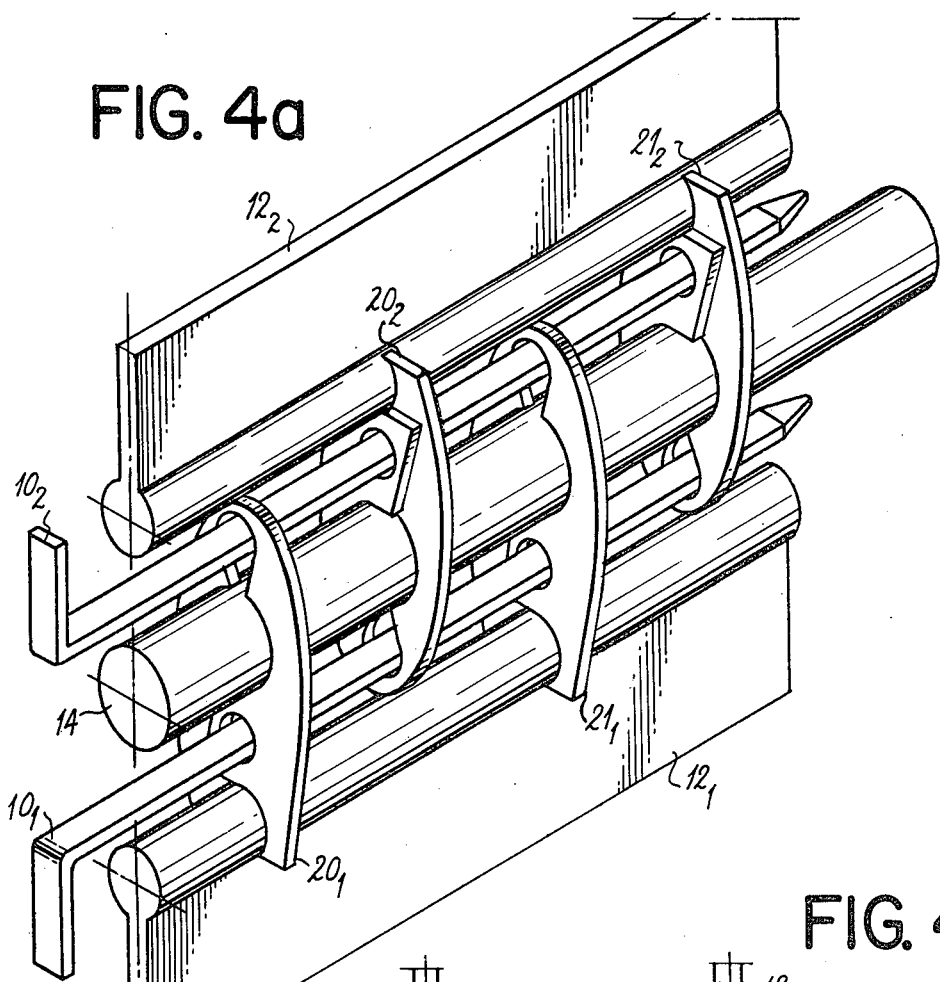
FIG. 4a
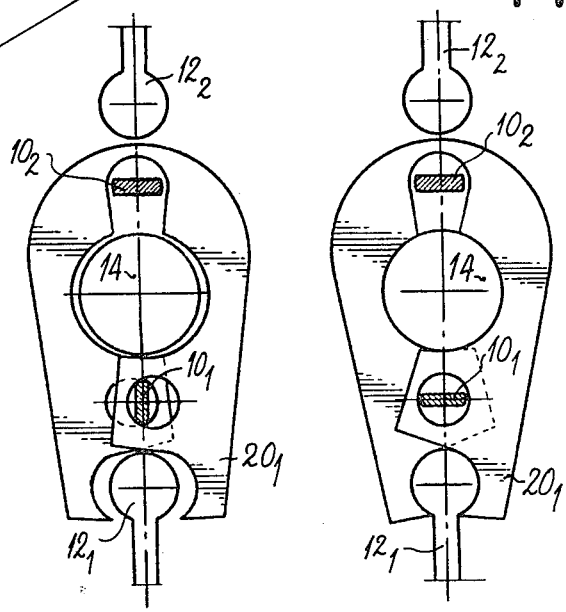
FIG. 4b
FIG. 4c

QUARTER-TURN-LOCKING THERMAL CONNECTOR

The present invention relates to a quarter-turn-locking thermal connector. It has an application in electronics.

In the past, the problem of the heat-dissipation in electronic systems has been given various solutions, e.g. by forced ventilation or installation of thermal radiators, by providing areas of free convection or by air-conditioning. None of these solutions is really satisfactory, since such solutions are all very expensive and difficult to carry out, and they are often less reliable than those systems to which they are applied; finally, they do not allow an easy recovery of the energy discharged.

That is why researches are now directed towards calorie discharge networks using thermal drains (e.g., by means of heat-transfer pipes, water circuits or freon). Such methods involve a full thermal circuitry, the function of which is to drain calories from their source up to dissipation or recovery collectors.

Moreover, new methods for the assembly of electronic components have been suggested recently, such methods making use of supports that are good thermal conductors (for instance, metal supports), so that the need is now felt for connectors capable of connecting such supports to the drains of a calorie discharge network.

However, such connectors are all the more difficult to obtain as they must meet various requirements (e.g. easy and quick setting, absence of special tooling, no interference with electrical connections).

The present invention brings a solution to the above problem by providing a thermal connector very easily put in operation, that does not interfere with electrical connections and even capable of mechanically holding the supports to which it is connected.

More specifically, the object of the present invention is to provide a thermal connector adapted to connect a calorie dissipating support to a thermal drain, said connector comprising a deformable metal two-part clamp, each part of which is constituted by two webs conforming to the shape of the dissipating support, as regards one of said clamp-parts, and the shape of the thermal drain, as regards the other clamp-part, said connector being also provided, between said two clamp-parts, with a housing for an actuating-key with longitudinal edges, said key having a position of rest at which said longitudinal edges do not exert any force whatever on the walls of said central housing, the webs of the end clamp-parts being then moved apart and said connector being unlocked, and a working position, obtained by causing said key to rotate by a quarter turn with respect to said position of rest, said key having then the function of moving apart the walls of said central housing and to draw the webs of each of said end clamp-parts nearer to each other, said connector being thus locked.

Other features and advantages of the present invention will appear from the following description, giving a few embodiments merely by way of examples, with reference to the following drawing, in which:

FIGS. 2a, 2b is a perspective view of the same connector;

FIGS. 4a, 4b, 4c shows a third embodiment of the connector according to the invention;

A first embodiment of the connector according to the invention is illustrated in FIGS. 1 and 2.

Figure 1A:
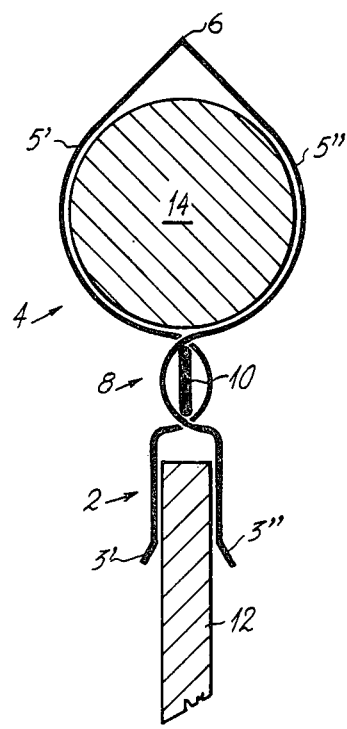
FIGS. 1a, 1b is a cross-section of a connector according to a first embodiment.
Figure 1B:
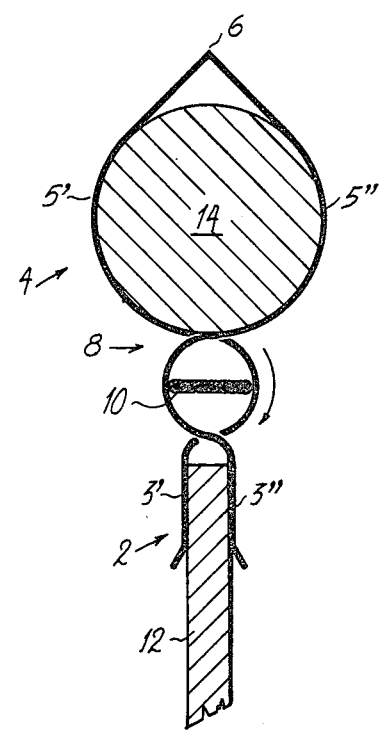

Said connector is shown in cross-section, in its unlocked position, in FIG. 1a, and in its locked position, in FIG. 1b, respectively. In the same way, it is show, in perspective, in its unlocked position, in FIG. 2a and in its locked position, in FIG. 2b.

The connector such as shown contains a first end clamp-part 2 comprising two webs 3' and 3", and a second end clamp-part 4 comprising two webs 5' and 5", the latter webs joining along a ridge 6 forming a dihedron. In the middle portion of said connector, a housing 8 is adapted to receive an actuating-key 10 with longitudinal edges. Webs 3' and 3" forming lower clamp-part 2 are flat, as is the heat-dissipating support 12 on which they are applied, whereas webs 5' and 5" of the upper clamp-part are of cylindrical shape, just as the drain 14 clamped between them.

The device operates as follows:

At rest, the key occupies a position represented in FIG. 1a and FIG. 2a, and its longitudinal edges are then in the plane of symetry of the whole unit: in that position, no action whatever is exerted on the walls of housing 8. The respective webs of the two clamp-parts are clamped neither on heat-dissipating support 12, nor on drain 14. When key 10 is caused to rotate by a quarter turn, its longitudinal edges are brought to a position at right angles to the plane of symetry of the whole unit. In that position, the walls of the central housing are moved apart, and, accordingly, webs 3' and 3" are clamped on support 12, while webs 5' and 5" are clamped on drain 14.

It is to be noticed that the connector as shown, in its upper portion, comprises a dihedron, the function of which is to provide a certain resiliency, to allow some tolerance in the manufacture of the drain and also to compensate possible clearances resulting from a thermal expansion of the various parts.

Figure 3A:
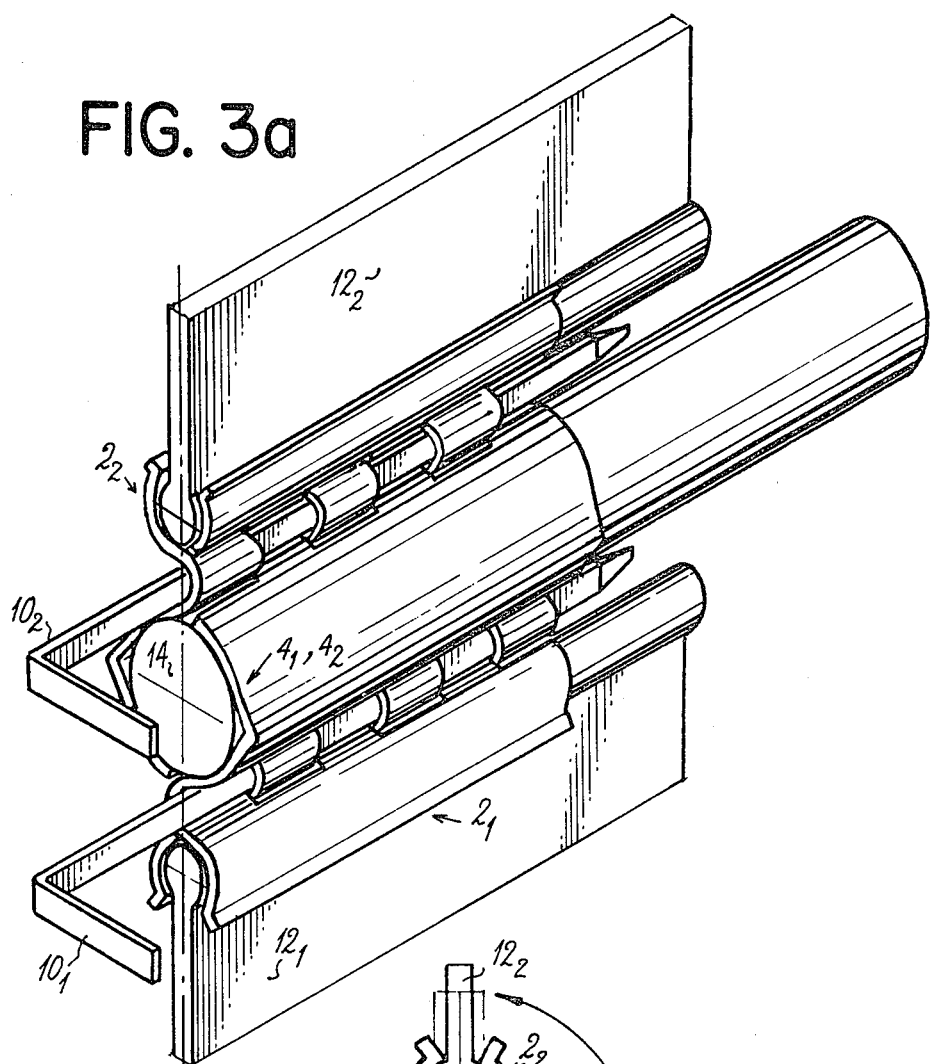
FIGS. 3a, 3b shows a second embodiment of the connector according to the invention.
Figure 3B:
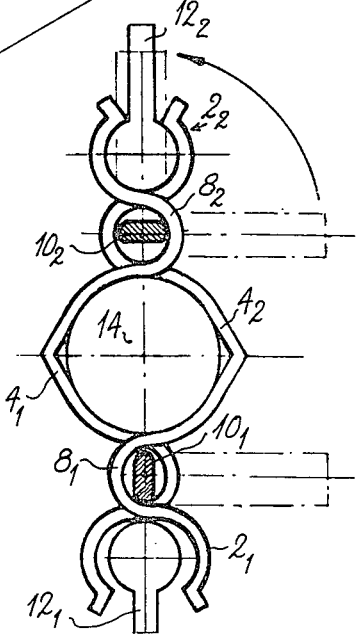

The connector of FIG. 3 is shown in perspective, in part (a) and, in cross-section, in part (b). According to that variant, the connector is provided with two pairs of clamps, the first of which is constituted by clamp-part $2_1$ and $4_1$, adapted to conform to the shape of a first heat-dissipating support $12_1$ and to the shape of a drain 14, respectively, whereas the second pair is constituted by clamp-parts $2_2$ and $4_2$ adapted to conform to the shape of a second heat-dissipating support $12_2$ and to the shape of the same drain 14 as above, clamp-parts $4_1$ and $4_2$ therefore forming but one clamp-part. An actuating-key is provided for each portion of said connector, viz. $10_1$ and $10_2$, respectively. In portion (a) of FIG. 3, the two keys are at their position of rest, whereas in portion (b) of said figure, key $10_2$ is at its locking position.

It will be noted that heat-dissipating supports $12_1$ and $12_2$ are each provided with an enlarged end portion permitting to obtain a better clamping effect of the connector webs.

In the embodiments shown in FIGS. 1 to 3, the various members forming the connector according to the invention are obtained by cutting a strip, then shaping said thus-cut strip by stamping or rolling. In the variant shown in FIG. 4, these members are constituted by cut blades $20_1$, $21_1 \ldots 20_2$, $21_2 \ldots$, which is perhaps more simple.

The operation of that device is the same as that of the variant shown in FIG. 3. It is illustrated by portions (b) and (c) of FIG. 4 showing, in cross-section, the positions of the members forming the lower portion of the connector when the associated key $10_1$ is at its position of rest (b) and at its locking position (c), respectively.

Figure 5A:
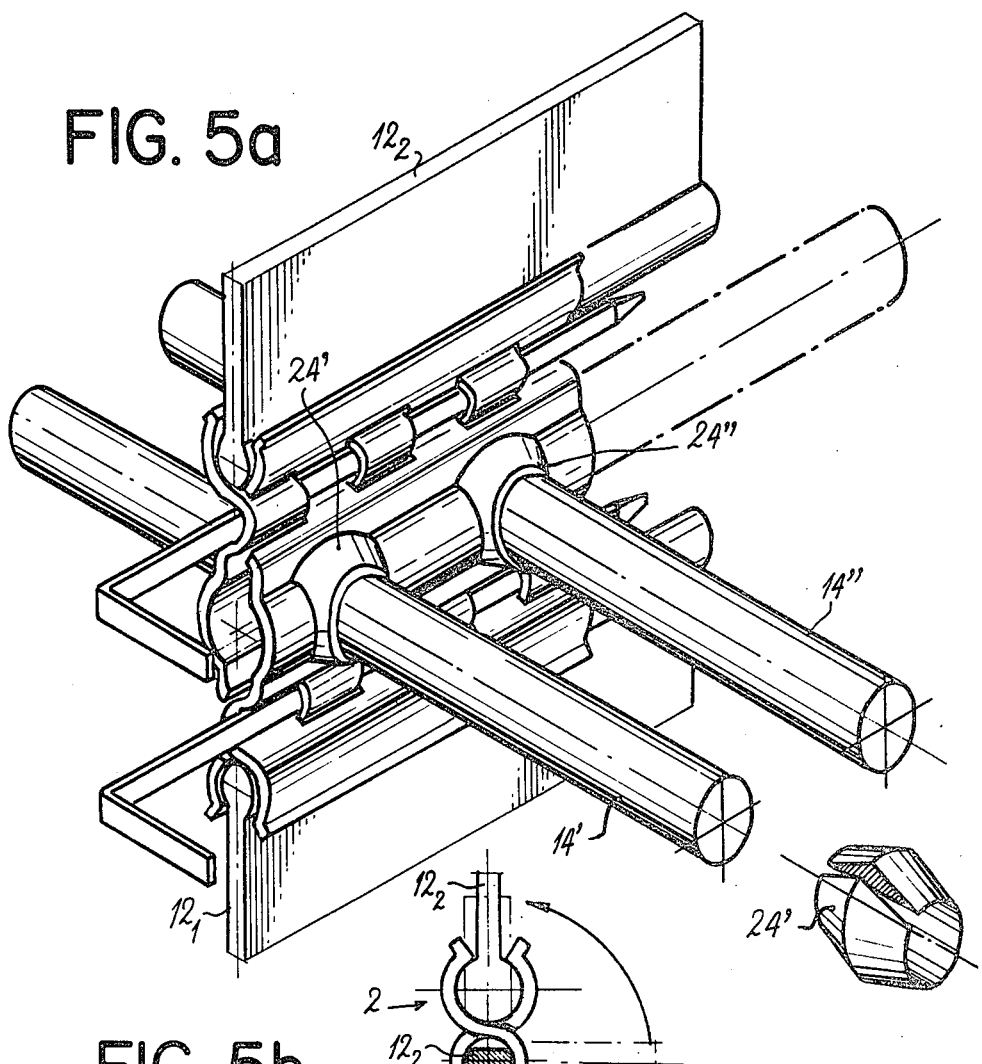
FIGS. 5a, 5b represents a fourth embodiment of the connector according to the invention, permitting connection with drains at right angles.
Figure 5B:
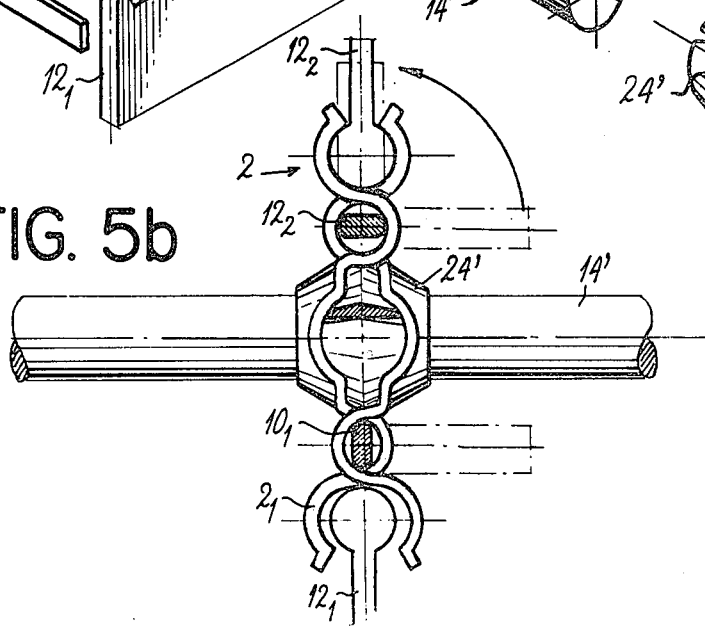

The connector such as shown in FIG. 5 differs from that of FIG. 3 only in that biconical slotted rings 24', 24" are provided, said rings receiving cylindrical drains 14', 14" ..., the axes of which are at right angles with the axis of drain 14. Portion (a) of FIG. 5 shows the connector in perspective with, on the right, a detail of a ring 24'; portion (b) of the same figure represents said connector in cross-section, its upper portion being clamped to support $12_2$, whereas its lower portion is open.

Figure 6:
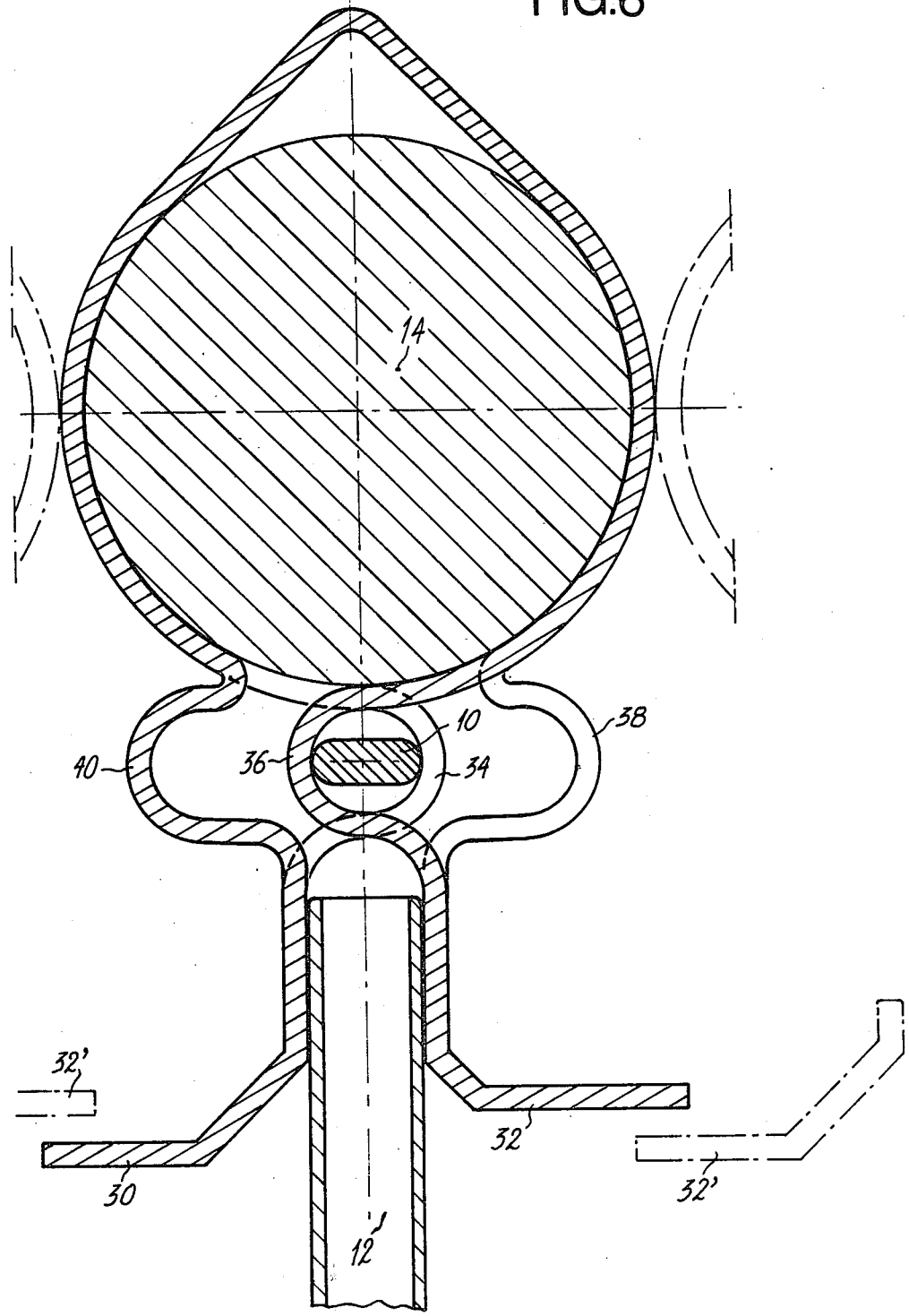
FIG. 6 is a cross-section of a fifth embodiment.

A novel feature of the connector shown in cross-section in FIG. 6 with respect to the above-described connector lies in that it is provided with flanges 30 and 32 in the lower portion thereof. These flanges constitute a baffle, or deflector, with flanges 32' and 30" of the neighbouring connectors, which constitutes a means for picking up the calories generated by heat-dissipating support 12, by taking advantage of the convection currents reaching these flanges. The exhaust of heat is thus improved. Those portions situated in the middle portion of the connector are obtained by making openings, then stamping the parts, in turn in one direction then in the other direction, so as to obtain either webs 34 and 36 required for housing actuating key 10, or webs 38 and 40 required for controlling. In this case, the whole section of the metal is used, so that the thermal conductivity of the connector is at its best.

Quite obviously, thermal drain 14, in the above description, has been given the shape of a circular cylinder only by way of example and, of course, such a shape and, accordingly, the shape of the webs of the end clamps might be quite different. The same remark is valid as regards the shape of the clamp-part associated with the heat-dissipating device, it being possible to give the latter a shape other than flat.

Figure 7:
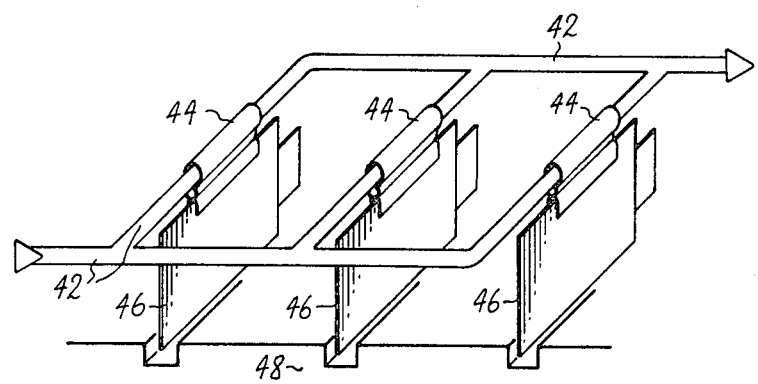
FIG. 7 is a diagrammatic view of an electronic card system, adapted to be connected to a calorie draining circuit by means of thermal connectors according to the present invention.

Finally, FIG. 7 is a very diagrammatic representation of a thermal draining installation for carrying out the present invention. That installation comprises thermal drains 42 connected, by means of connectors 44 according to the invention, to cards 46, said cards having the function of supporting heat-dissipating electronic components and being embedded in a frame 48. A thermal conduction flux is established from cards 46 to drains 42 via connectors 44, then via said drains, to a collector (not shown).

What is claimed is:

1. A thermal connector adapted to connect a calorie dissipating support to a thermal drain, said connector comprising a deformable metal two-part clamp, each part of which is constituted by two webs conforming to the shape of the dissipating support, as regards one of said clamp-parts, and the shape of the thermal drain, as regards the other clamp-part, said connector being also provided, between said two clamp-parts, with a housing for an actuating-key with longitudinal edges, said key having a position of rest at which said longitudinal edges do not exert any force whatever on the walls of said central housing, the webs of the end clamp-parts being then moved apart and said connector being unlocked, and a working position, obtained by causing said key to rotate by a quarter turn with respect to said position of rest, said key having then the function of moving apart the walls of said central housing and to draw the webs of each of said end clamp-parts nearer to each other, said connector being thus locked.

2. An assembly comprising two connectors according to claim 1, said two connectors having a central clamp-part in common, and two clamp-parts arranged symetrically with respect to said central clamp-part.

3. A connector according to any of claims 1 and 2, wherein the walls thereof are obtained from members cut in a strip, then suitably shaped by stamping or rolling.

4. A connector according to any of claims 1 and 2, constituted by cut blades.

5. A connector according to claim 2, wherein said central clamp-part is provided with slotted biconical rings, the axes of which are at right angles to that of said central clamp-part.

* * * * *